July 16, 1963 J. A. SAMWEL 3,098,216

TRANSISTOR COMMON-EMITTER GATE CIRCUIT WITH INDUCTIVE LOAD

Filed July 13, 1959

INVENTOR
JOHANNES ARNOLDUS SAMWEL
BY
AGENT

United States Patent Office 3,098,216
Patented July 16, 1963

3,098,216
TRANSISTOR COMMON-EMITTER GATE CIRCUIT WITH INDUCTIVE LOAD

Johannes Arnoldus Samwel, Eindhoven, Netherlands, assignor to North American Philips Company, Inc., New York, N.Y., a corporation of Delaware
Filed July 13, 1959, Ser. No. 826,525
Claims priority, application Germany July 17, 1958
7 Claims. (Cl. 340—166)

Figure 1:
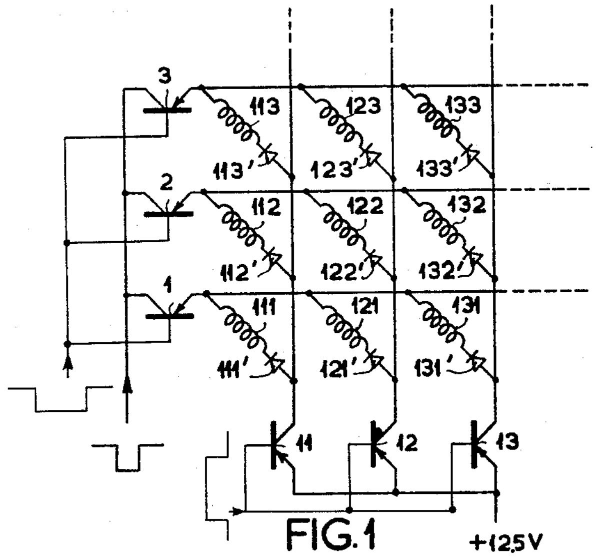

The invention relates to a gate circuit comprising a transistor; pulses having a polarity to reverse-bias the collector-base junction are fed to the collector and these pulses produce current pulses across a load included in the emitter circuit, the production of the current pulses depending on a control-signal fed to the base.

Such an arrangement has the advantage that the transistor operates as a pulse-fed emitter follower amplifier having a low output impedance and a high base input impedance. This arrangement is therefore very advantageous and is frequently used with an ohmic or a capacitataive load. The arrangement could be particularly advantageous to control magnetic storage elements, since this control takes place by means of windings having restricted number of turns, thus requiring considerable magnitudes of current. These windings, however, constitute inductive loads, through which the leading edge of the collector-supply-pulse produces sharp reverse voltage peaks, so that under certain conditions, the emitter of the transistor may be polarized in the reverse direction with respect to the base and, in spite of the presence of a forward base-control-signal, the transistor is immediately cut off again.

A logical solution of this difficulty would be to choose the amplitude of the signal fed to the base to be so high as to exceed the amplitude of the reverse voltage pulses produced across the load by the current pulses. However, the maximum permissible transistor dissipation would then very soon be exceeded; as a rule, therefore, this solution cannot be used. When it is used it involves the use of comparatively slow transistors with high dissipation in which the control itself also requires considerable energy.

The invention has for its object to obviate this disadvantage of pulse-fed emitter follower amplifiers and to allow their use in conjunction with an inductive load.

The transistor gate circuit according to the invention is characterized in that, with an amplitude of the control-signal fed in the forward direction to the base materially lower than the amplitude of the comparatively short reverse voltage pulses produced across the load, the base current produced by the said control-signal is chosen to be materially higher than the value corresponding to the saturation value of the collector current, so that the control-signal produces an excess of free charge carriers in the base zone of the transistor, these free charge carriers preventing a transient cut-off of the transistor by the subsequent reverse voltage pulse.

As stated above, the arrangement according to the invention is particularly suitable for controlling magnetic storage elements. Such elements are read-in and read-out by means of so-called matrices which, at each pulse of a sequence of so-called clock pulses and by means of a cascade of switching elements, choose a given read-in or read-out winding, for example the winding of a given magnetic writing head.

Reading-in requires a magnetisation current pulse to be conveyed through the selected writing winding via the two switching elements, a reverse voltage pulse being then produced across the read-in winding. The gate circuit according to the invention is particularly suitable for such cascades of switching elements. Such a cascade of two switching elements has, in addition, the advantage that the elements of each series-combination of two switching elements may be constituted by transistors of the same conductivity type, one of the transistors operating as a collector pulse-fed emitter follower amplifier, the other operating in grounded emitter connection.

The invention will now be described more fully with reference to the drawing, in which FIG. 1 shows the general circuit diagram of part of a matrix with gate circuits according to the invention.

Figure 3:
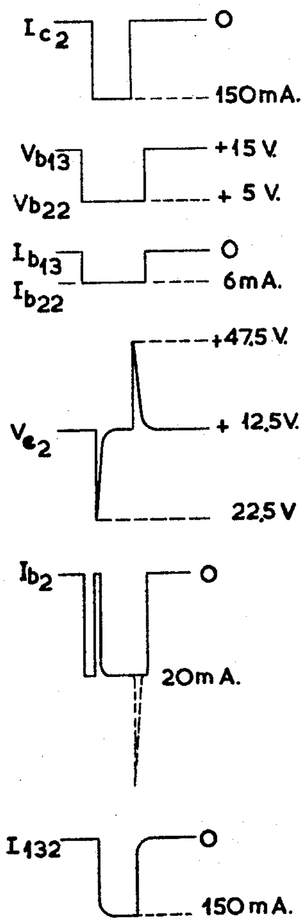
Figure 2:
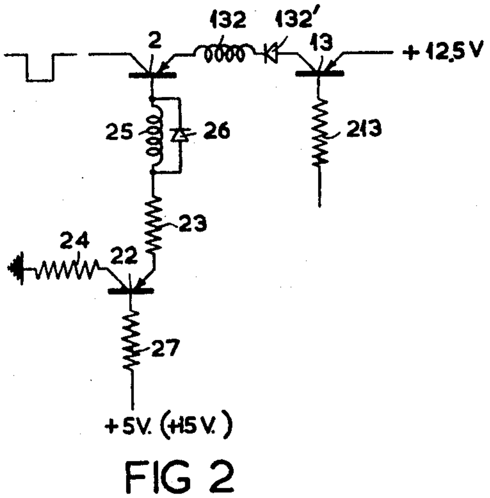

FIG. 2 shows the circuit diagram of the series-combination of two switching elements of the said matrix and FIG. 3 shows current and voltage time diagrams at different points of the said series-combination.

FIG. 1 shows the circuit diagram of part of a matrix serving to select a writing head from a plurality of writing heads 111, 112 . . . 121, 122 . . . 131, 132 . . . . These writing heads are used, for example, to record information in the form of a magnetic state of a given part of a magnetic drum. To this end, a read-in pulse must be conveyed through the selected writing head. The writing heads are selected by means of rows and columns of switching elements, arranged crosswise. These switching elements are transistors of the p-n-p-type, in which, in accordance with the invention, the transistors 1, 2, 3 . . . of the rows operate as collector-fed emitter follower amplifiers, and the transistors 11, 12, 13 and so on of the columns are arranged in grounded emitter connection. All transistors are base-controlled. The writing head 132 is selected, for example, by means of the transistors 13 and 2 rendered conductive by the supply of a negative pulse to the base electrodes concerned, so that a negative pulse, which is fed simultaneously to the collector electrodes of all transistors 1, 2, 3, and so on of the rows, passes via the collector-emitter paths of the transistors 2 and 13 through a coil 132 and through a series-connected diode 132'.

FIG. 2 shows the complete circuit diagram of the series-combination of the transistors 2 and 13 and of the writing coil 132 with the diode 132'. The transistor 13 is directly controlled by a negative-pulse supply, which is connected to its base via a resistor 213 of, for example, 1.2K ohms. The emitter is connected to a point of fixed potential of, for example, +12.5 v. and the potential at the output of the control-pulse supply varies between +15 v., when the transistor 13 is cut off, and +5 v., a current of about 6 ma. being then produced, via the resistor 213, between the emitter and the base of the transistor 13. The transistor 13, assuming the examples of voltage and current given above, is of the type OC 76, which is already saturated at a base current of 5 ma.

The transistor 2 is of the same type as transistor 13. According to the invention, however, the base electrode receives a control-current of at least 20 ma., so that this transistor is very strongly saturated and an excess of free charge carriers is stored in its base zone. To this end this transistor is controlled via a control-transistor 22. The transistor 22 is base-controlled as the transistor 13, but via a resistor 27 of 3.3K ohms. The collector is connected to earth via a resistor 24 of 390 ohms and the emitter feeds the base electrode of the transistor 2, via a resistor 23 of 220 ohms and a series-connected inductor 25, which is shunted by a diode 26, connected in the blocking direction with respect to the emitter current of the transistor 22.

FIG. 3 shows current and voltage time diagrams at different points of the series-combination shown in FIG. 2. The first line of this figure represents a negative current pulse Ic2 fed to the collector electrode of the transistor 2. The second line represents a selection pulse Vb13—Vb22 fed simultaneously via the resistor 213 to the base electrode of the transistor 13 and via the resistor 27 to the base electrode of the transistor 22. The third line represents the current pulse Ib13—Ib22, thus produced in the base-emitter circuit of the transistor 13 and in the base-circuit of the transistor 22 respectively.

It will be seen that a current pulse of 150 ma. is to be fed to the writing coil 132; the amplitude of the control-pulses is 10 v. (+15 v. minus +5 v.) and the base current of the transistor 13 attains a value of 6 ma., which can be derived from the voltage difference between the emitter (+12.5 v.) and the control-point (+5 v.) and from the value of the resistor 213. The internal resistance of the base-emitter path of the transistor 13 is low with respect to the resistor 213.

The control-pulse Ib 2, amplified by the transistor 22 and fed to the base electrode of the transistor 2, is indicated on the fifth line of FIG. 3. The base current of the transistor 2 reaches rapidly a value of 20 ma., so that this transistor is strongly saturated. At this instant when the negative pulse is applied to the collector electrode of the ransistor 2, the two transistors 2 and 13 are strongly conductive. The diode 132′ is connected in the pass direction with respect to this current pulse, so that the leading edge of the current pulse Ic2 can be freely operative at the terminals of the writing coil 132, which constitutes an inductive load. Accordingly, this leading edge produces a sharp, high reverse voltage peak across this coil. This peak is shown on the fourth line (Vc2) of FIG. 3 and reaches a value of about 34 v. for an inductance of the coil 132 of 0.2 mh. Accordingly, the emitter of the transistor 2 becomes transiently strongly negative with respect to its base electrode, so that this transistor would again be cut off, if its base zone did not contain an excess of free charge carriers. Owing to this excess of free charge carriers, a temporary interruption of the base current of the transistor 2 does not bring about an interruption of the current pulse via the series-connected transistors 2 and 13 and through the writing coil 132 and the diode 132′. This temporary interruption is indicated on the fifth line of FIG. 3, and the current pulse I132 through the coil 132 is indicated on the last line of this FIGURE. During the negative voltage peak at the emitter of the transistor 2 the current required for the pulse through the writing coil 132 is simply taken from the reserve of free charge carriers in the base zone of the transistor 2.

At the end of the current pulse Ic2 fed to the collector of the transistor 2, owing to an abrupt interruption of the current through the writing coil 132, the trailing edge of this pulse produces a sharp positive voltage peak at the emitter of the transistor 2. After the end of the collector current pulse, this sharp positive peak could also pass through the emitter-based path and the control-pulse supply, and thus be reduced, which would adversely affect the flank steepness of the current pulse and the useful effect of the writing device. The sharp strong base current peak (indicated in broken lines on the fifth line of FIG.3) is, however, suppressed by the inductor 25 and is not capable of producing a reverse voltage peak in this inductor, since the inductor is strongly damped by the diode. The trailing edge of the pulse through the writing coil 132 is therefore only very slightly distorted.

The diode 132′ and the corresponding diodes of the various writing coils of the matrix partly shown in FIG. 1, separate the various writing coils of a row or a column from each other, so that the voltage pulses produced by a current pulse across a writing coil cannot produce currents through the other writing coils.

Apart from the strong distortion of the current pulses through the writing coil 132, the temporary cutting-off of the transistor 2 of FIG. 2 would strongly increase the dissipation in this transistor, which dissipation would soon be liable to exceed the maximum permissible value. Also when the base electrode of this transistor is controlled by means of a voltage having a larger amplitude than the reverse voltage peak across the inductive load and effective at its emitter, the permitted limit of the dissipation in the transistor and/or of the emitter-base voltage would soon be exceeded.

Apart from the use described above in a matrix or in similar devices, in which the production of a current pulse through an inductive load is to be rendered dependent upon the simultaneous occurrence of two selection- or control-signals, the gate circuit according to the invention may be used in any case in which an inductive load is to be fed solely by current pulses via a transistor connected as an emitter follower amplifier. The emitter follower amplifying arrangement may then often be very efficient owing to its low internal resistance and its high input resistance.

It is also to be understood that what has been disclosed above is a preferred embodiment of the invention, other modifications readily occurring to those skilled in the art. In particular, it is noted that the quantitative values given the various circuit components are for illustrative purposes only and are not meant to limit the invention, the scope of which is delineated in the following claims.

What is claimed is:

1. A circuit for supplying an input pulse to an inductive load comprising: a transistor having base, emitter and collector electrodes, collector-base and emitter-base junctions and a base zone, means for applying an input voltage signal pulse to said collector electrode having a polarity to reverse-bias said collector-base junction, an inductive load, said emitter electrode being coupled to said inductive load, means operable to complete a circuit to said inductive load including means applying a gating signal to said base electrode, said gating signal having a polarity and magnitude to drive said base electrode beyond saturation in the forward direction thereby producing an excess of free charge carriers in the base zone, said input pulse and said gating signal being simultaneously applied, said input pulse having a leading edge operable to cause a short voltage pulse to be produced across said inductive load which materially exceeds said gating signal in amplitude and biases the emitter-base junction in the reverse direction, said excess of free charge carriers preventing the cutting off of said transistor at the occurrence of said short voltage pulse.

2. A circuit as claimed in claim 1, the coupling to said base electrode including a resistor.

3. A circuit as claimed in claim 1, the coupling to said base electrode including a series-connected inductor.

4. A circuit as claimed in claim 2, the coupling to said base electrode further including a series-connected inductor and a diode connected in parallel with said inductor, said diode being connected in the blocking direction with respect to the emitter-base junction.

5. A circuit as claimed in claim 1, the coupling to said base electrode further including a control transistor having base, emitter and collector electrodes, the collector electrode of the control transistor being connected to a point of constant potential, the emitter electrode of the control transistor being coupled to the base electrode of the first-mentioned transistor, and the base electrode of said control transistor being coupled to said gating signal.

6. A circuit as claimed in claim 3, the coupling to said base electrode further including a control transistor having base, emitter and collector electrodes, the collector electrode of the control transistor being connected to a point of constant potential, the emitter electrode of the control transistor being coupled to the base elecrode of the first-mentioned transistor through said series-connected inductor, and the base electrode of said control transistor being coupled to said gating signal.

7. A matrix circuit arrangement for selecting one inductive element from a group of inductive elements comprising: a group of inductive elements arranged in a series of rows and columns, a first plurality of transistors each having base, emitter and collector electrodes, collector-base and emitter-base junctions and a base zone, a second plurality of transistors each having base, emitter and collector electrodes, each inductive element being coupled at one end to the emitter electrode of one of said first plurality of transistors and at the other end to the collector electrode of one of said second plurality of transistors, means for selectively applying an input voltage signal pulse to the collector electrode of one of said first plurality of transistors, said input pulse having a polarity to reverse-bias the collector-base junction of said one transistor, means operable to complete a circuit to an inductive element including means selectively applying a first gating signal to the base electrode of said one transistor, said first gating signal having a polarity and magnitude to drive the associated base electrode beyond saturation in the forward direction thereby producing an excess of free charge carriers in the base zone, means operable to complete a circuit to an inductive element including means selectively applying a second gating signal to the base electrode of one of said second plurality of transistors, said second gating signal having a polarity and magnitude to drive the associated base electrode in the forward direction, said input pulse and gating signals all occurring simultaneously.

References Cited in the file of this patent

UNITED STATES PATENTS

| | | |
|---|---|---|
| 2,774,888 | Trousdale | Dec. 18, 1956 |
| 2,843,761 | Carlson | July 15, 1958 |
| 2,885,572 | Felker | May 5, 1959 |
| 2,928,080 | Auerbach | Mar. 8, 1960 |
| 2,950,461 | Tryon | Aug. 23, 1960 |